(12) United States Patent
Pinter et al.

(10) Patent No.: US 11,906,383 B2
(45) Date of Patent: Feb. 20, 2024

(54) MICROMECHANICAL SENSOR DEVICE HAVING AN ASIC CHIP INTEGRATED INTO A CAPPING UNIT AND CORRESPONDING MANUFACTURING METHOD

(71) Applicant: Robert Bosch GmbH, Stuttgart (DE)

(72) Inventors: Stefan Pinter, Reutlingen (DE); Nico Greiner, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 390 days.

(21) Appl. No.: 17/282,870

(22) PCT Filed: Jan. 20, 2020

(86) PCT No.: PCT/EP2020/051260
§ 371 (c)(1),
(2) Date: Apr. 5, 2021

(87) PCT Pub. No.: WO2020/156852
PCT Pub. Date: Aug. 6, 2020

(65) Prior Publication Data
US 2021/0348976 A1 Nov. 11, 2021

(30) Foreign Application Priority Data
Jan. 31, 2019 (DE) .......................... 102019201224.8

(51) Int. Cl.
*G01L 9/00* (2006.01)
*B81B 7/00* (2006.01)
*B81C 1/00* (2006.01)

(52) U.S. Cl.
CPC .......... *G01L 9/0052* (2013.01); *B81B 7/0048* (2013.01); *B81B 7/0058* (2013.01);
(Continued)

(58) Field of Classification Search
None
See application file for complete search history.

(56) References Cited

U.S. PATENT DOCUMENTS

| 11,287,346 B2* | 3/2022 | Rajaraman | .......... G01L 19/0007 |
| 2006/0130582 A1 | 6/2006 | Kurogi | |

(Continued)

FOREIGN PATENT DOCUMENTS

| CN | 103968886 A | 8/2014 | |
| DE | 102011084582 B3 | 2/2013 | |
| WO | WO-2014102121 A1 * | 7/2014 | ......... B81C 1/00269 |

OTHER PUBLICATIONS

International Search Report PCT/EP2020/051260 dated Apr. 7, 2020.

*Primary Examiner* — Peter J Macchiarolo
*Assistant Examiner* — Jermaine L Jenkins
(74) *Attorney, Agent, or Firm* — NORTON ROSE FULBRIGHT US LLP

(57) ABSTRACT

A micromechanical sensor device and a corresponding manufacturing method are described. The micromechanical sensor device is fitted with a substrate including a front side and a rear side; a micromechanical sensor chip including a sensor area attached to the front side of the substrate; and a capping unit attached to the front side of the substrate, which is formed at least partially by an ASIC chip. The capping unit surrounds the micromechanical sensor chip in such a way that a cavity closed toward the front side of the substrate is formed between the sensor area of the micromechanical sensor chip and the ASIC chip. A mold package is formed above the capping unit.

13 Claims, 15 Drawing Sheets

(52) U.S. Cl.
CPC ........ *B81B 7/0064* (2013.01); *B81C 1/00325* (2013.01); *B81B 2201/0264* (2013.01); *B81B 2203/0127* (2013.01); *B81B 2207/012* (2013.01); *B81B 2207/098* (2013.01); *B81C 2203/0792* (2013.01)

(56) References Cited

U.S. PATENT DOCUMENTS

| | | | |
|---|---|---|---|
| 2011/0261428 A1* | 10/2011 | Pinter | G02B 26/0833 356/73 |
| 2016/0159642 A1 | 6/2016 | Hooper et al. | |
| 2017/0217762 A1 | 8/2017 | Hoekstra | |
| 2020/0002159 A1* | 1/2020 | Theuss | B81B 7/0032 |

\* cited by examiner

MICROMECHANICAL SENSOR DEVICE HAVING AN ASIC CHIP INTEGRATED INTO A CAPPING UNIT AND CORRESPONDING MANUFACTURING METHOD

FIELD

The present invention relates to a micromechanical sensor device and to a corresponding manufacturing method.

BACKGROUND INFORMATION

Although arbitrary micromechanical components are also applicable, the present invention and the problem underlying it are explained with reference to micromechanical pressure sensor devices.

German Patent Application No. DE 10 2011 084 582 B describes a micromechanical pressure sensor device including a substrate, a circuit chip attached to the substrate and a mold package, in which the circuit chip is packaged. The mold package includes a recess above the circuit chip, in which a sensor chip is provided. The mold package includes a through-hole at the base of the recess opened with the aid of a laser beam and extending to a metallization area, via which an electrical connection of the sensor chip to the substrate is guided on the metallization area.

SUMMARY

The present invention provides a micromechanical sensor device and a corresponding manufacturing method.

Preferred refinements and embodiments of the present invention are described herein.

In accordance with an example embodiment of the present invention, the ASIC chip is integrated into the capping unit. The ASIC chip thus serves as protection for the micromechanical sensor chip from the molding compound. The structure according to the present invention enables a mechanical decoupling of the micromechanical sensor chip from influences by the assembly and packaging technology. This type of stress decoupling of the micromechanical sensor chip allows for a minimized influencing of the sensor signals by mechanical stresses in the package.

By omitting the need for a separate cap element above the micromechanical sensor chip, minimal overall component dimensions are implementable. The manufacture may be achieved via standard processes in the assembly and packaging process such as, for example, wire bonding, extrusion coating/molding, separation, adhesive bonds, etc.

This allows for a further reduction of the costs for manufacturing micromechanical sensors, for example, pressure sensors or gas sensors.

According to one preferred refinement of the present invention, the ASIC chip includes a trough-like recess, which includes a circumferential ring-shaped edge area, which is indirectly or directly attached to the front side of the substrate. This makes it possible for the ASIC chip to form the major portion of the capping unit.

According to one further preferred refinement of the present invention, the ASIC chip has a planar design and is attached via a ring-shaped spacer unit on the front side of the substrate. This enables the ASIC chip to be integrated without modifications into the capping unit.

According to one further preferred refinement of the present invention, the ASIC chip partially covers the micromechanical sensor chip and includes a recess that has a u-shaped edge area, which is attached directly on the front side of the substrate, the open portion of the u-shaped edge area being attached directly on the micromechanical sensor chip. This enables the micromechanical sensor chip to be only partially capped, in particular, if it is designed larger than the ASIC chip.

According to one further preferred refinement of the present invention, the ASIC chip partially covers the micromechanical sensor chip and has a planar design and is attached directly on the front side of the substrate via a u-shaped spacer unit, the ASIC chip in the open portion of the u-shaped spacer unit being directly attached to the micromechanical sensor chip. This enables the ASIC chip to be integrated into the capping unit without modifications and to only partially cap the sensor chip in the process.

According to one further preferred refinement of the present invention, a through-opening in the substrate toward the rear side of the substrate forms a media access opening to the cavity. Thus, the media access may be implemented in an area in which no molding compound is present.

According to one further preferred refinement of the present invention, a microporous diaphragm is attached to the rear side of the substrate above the through-opening. This enables the sensitive sensor areas to be protected from foreign particles.

According to one further preferred refinement of the present invention, the micromechanical sensor chip is bonded onto the front side of the substrate in a linear or punctiform manner. This allows stress influences to be further reduced.

According to one further preferred refinement of the present invention, the micromechanical sensor chip is a pressure sensor chip. The package according to the present invention is particularly effective for pressure sensor chips.

According to one further preferred refinement of the present invention, the substrate is an LGA (line grid array) substrate. This provides flexible electrical connection possibilities.

BRIEF DESCRIPTION OF THE DRAWINGS

Further features and advantages of the present invention are explained below based on specific embodiments with reference to the figures.

DETAILED DESCRIPTION OF EXAMPLE EMBODIMENTS

Figure 1A:
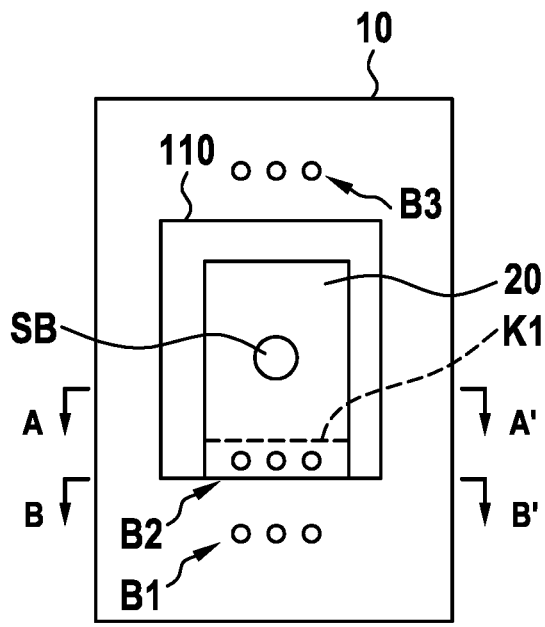
FIGS. 1a) through 1c) through 4a) through 4c) schematically show representations for explaining a micromechanical sensor device and a corresponding manufacturing method according to a first specific embodiment of the present invention.
Figure 1B:
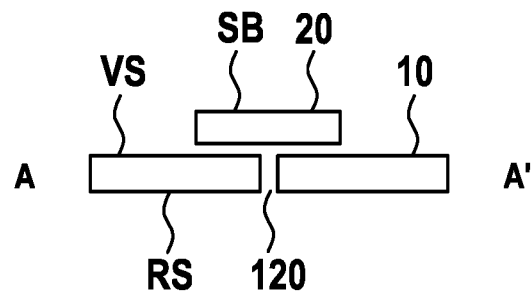

In the figures, identical or functionally identical elements are identified by identical reference numerals.

FIGS. 1a) through 1c) through 4a) through 4c) schematically show representations for explaining a micromechanical sensor device and a corresponding manufacturing method according to a first specific embodiment of the present invention.

Figure 1C:
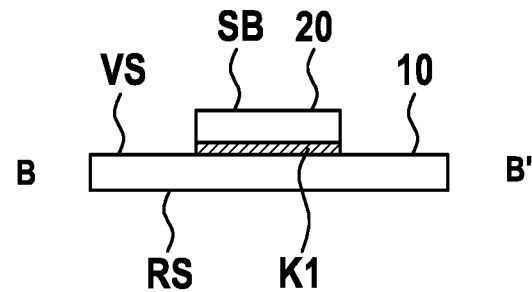

FIGS. 1a) through 4a) are schematic top views, FIGS. 1b through 4b are schematic cross sectional views along line A-A' in FIGS. 1a) through 4a) and FIGS. 1c) through 4c) are schematic cross sectional views along line B-B' in FIGS. 1a) through 4a).

In FIGS. 1a) through 1c), reference numeral 10 identifies an LGA (line grid array) substrate, which includes a front side VS and a rear side RS. A metallized surface 110 is applied to front side VS of substrate 10 which, for reasons of simplicity, is indicated only in FIG. 1a. Metallized surface 110 is used for the shielding of electromagnetic irradiations originating from rear side RS by setting it, for example, to a defined electrical potential during operation of the sensor device. A micromechanical pressure sensor chip 20 including a sensor area SB which is formed, for example, by a diaphragm and a piezo-resistive resistance device, not described here in greater detail since it conventional, is initially provided.

Micromechanical sensor chip 20 in the form of the pressure sensor chip is initially partially bonded onto front side VS of the substrate within metallized surface 110 with the aid of a first adhesive layer K1. The partial adhesive bonding serves to minimize the effect of mechanical strain by substrate 10 on micromechanical sensor chip 20, and to enable a media access via at least one through-opening 120, which is formed in substrate 10.

The partial adhesive bonding may be implemented in a linear (as shown here) and/or in a punctiform manner. In order to prevent a tilting of micromechanical sensor chip 20 during the adhesive bonding, micromechanical sensor chip 20 may optionally be temporarily held during this process step at an appropriate distance to substrate 10 from rear side RS via through-opening(s) 120 with the aid of support pin. As mentioned above, through-opening 120 is also the pressure connection for micromechanical sensor chip 10 during the sensor operation.

Reference sign B1 identifies a first bond pad arrangement on front side VS of substrate 10, which is situated correspondingly to a second bond pad arrangement B2 on micromechanical sensor chip 20. A third bond pad arrangement B3 is situated, for example, on an opposite side of substrate 10 and corresponds to a fourth bond pad arrangement B4 on ASIC chip 60 to be attached, as is explained below (cf. FIG. 3a)).

Figure 2A:
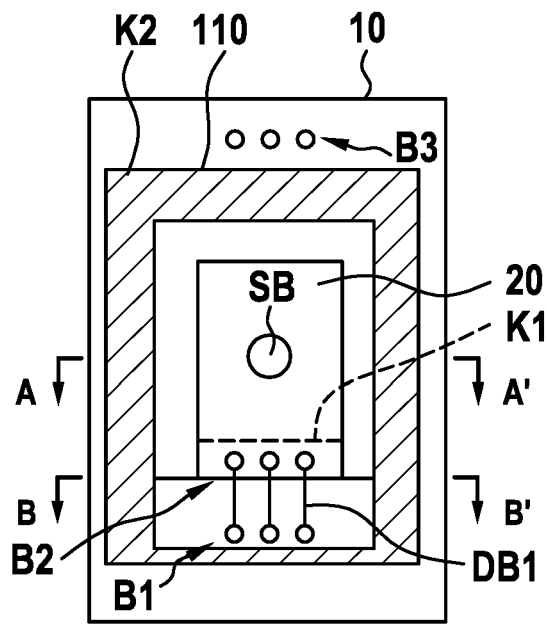
Figure 2B:
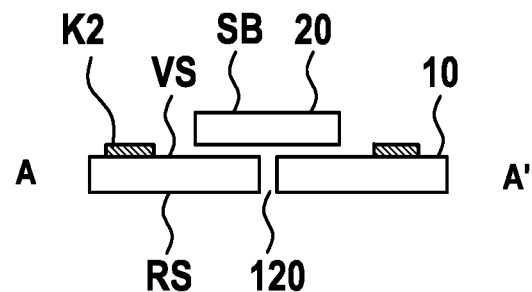
Figure 2C:
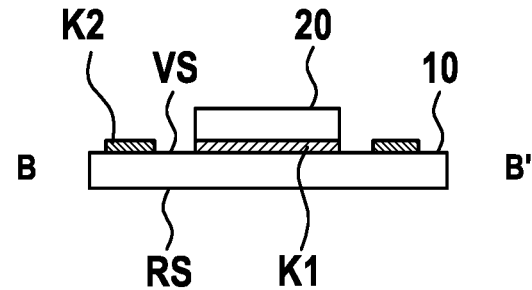

Further with respect to FIGS. 2a) through 2c), an electrical connection of first bond pad arrangement B1 to second bond pad connection B2 takes place via a wire bonding unit DB1. A second adhesive layer K2 is subsequently applied in a frame-like manner around micromechanical sensor chip onto front side VS of substrate 10, which surrounds micromechanical sensor chip 20 spaced apart therefrom.

Figure 3A:
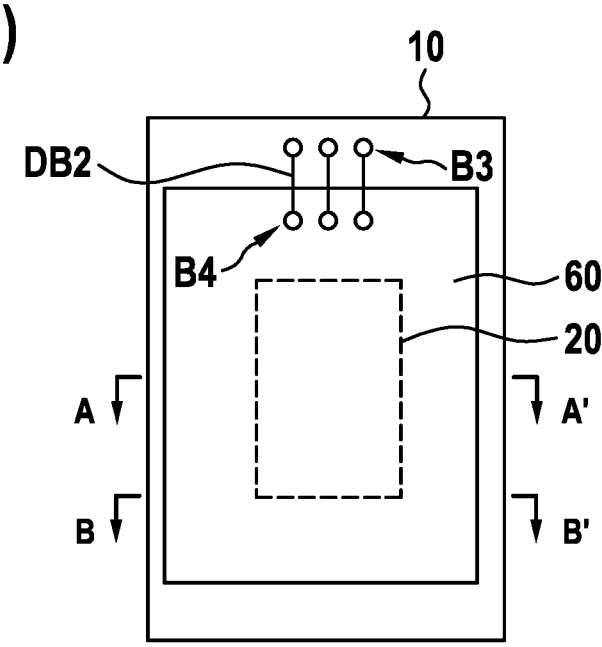
Figure 3B:
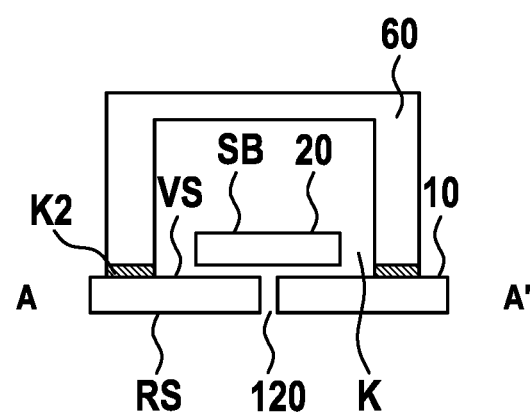
Figure 3C:
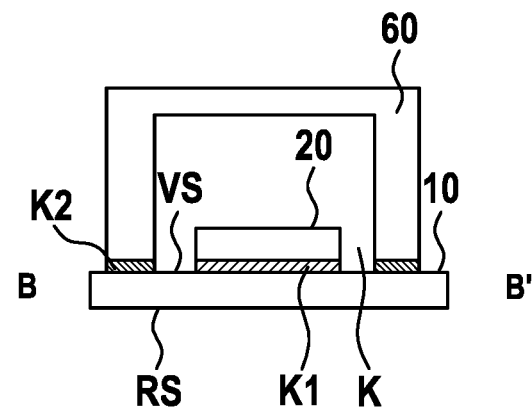

As depicted in FIGS. 3a) through 3c), an ASIC chip 60 including a trough-like recess W, which has a circumferential ring-shaped edge area R, is subsequently bonded onto front side VS of substrate 10. After the curing of second adhesive layer K2, an electrical connection is established between third bond pad arrangement B3 and fourth bond pad arrangement B4 corresponding thereto provided on ASIC chip 60 with the aid of a second wire bonding unit DB2.

After this process step, a cavity K closed toward front side VS of substrate 10 is produced between sensor area SB of micromechanical sensor chip 20 and ASIC chip 60, which includes the media access opening in the form of through-hole 120 at rear side RS of substrate 10.

In this specific embodiment, micromechanical sensor chip 20 is capped solely by ASIC chip 60 including the trough-like recess W.

Figure 4A:
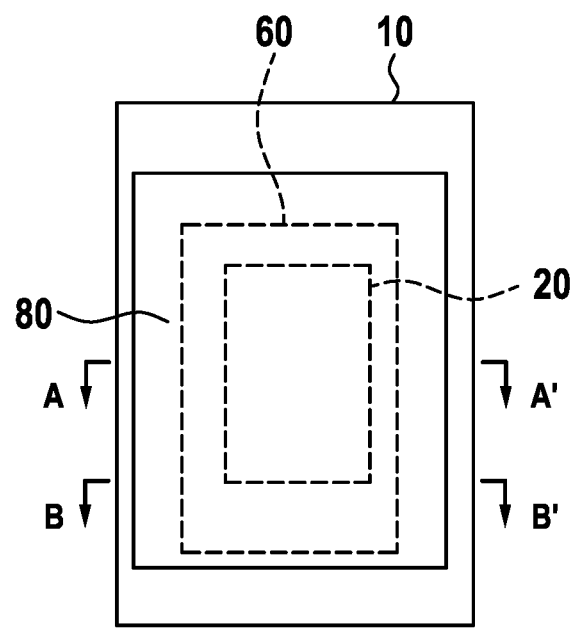
Figure 4B:
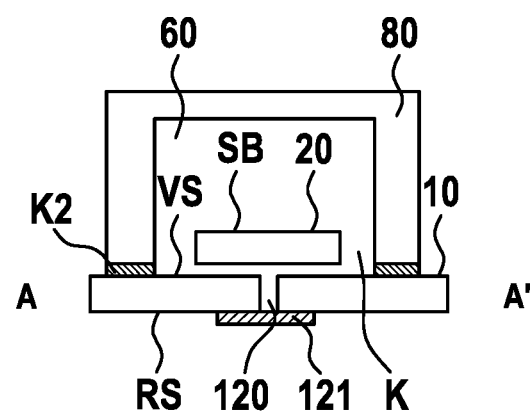
Figure 4C:
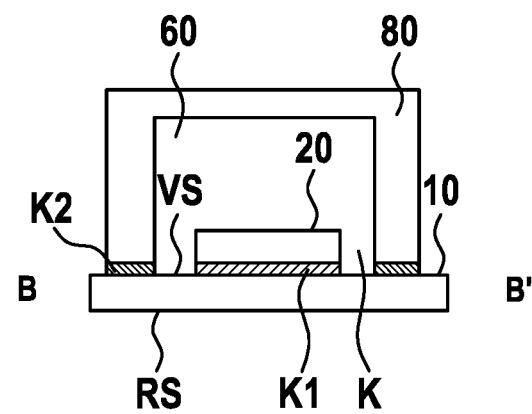

Finally, with respect to FIGS. 4a) through 4c), the capped chip stack made up of micromechanical sensor chip 20 and ASIC chip 60 is extrusion-coated with a molding compound in order to form a mold package 80 over the chip stack.

For dust and water protection, a microporous diaphragm 121, for example, made of expanded polytetrafluoroethylene (ePTFE), may be applied above through-opening 120 on rear side RS of substrate 10.

Corresponding to metallized surface 110 on the underside of micromechanical sensor chip 20, a shielding from the upper side may take place during operation via ASIC chip 60 by also setting its mass to a defined electrical potential.

Although the description of this first specific embodiment was related to one individual micromechanical sensor device, it is also possible to manufacture a plurality of these micromechanical sensor devices on a single substrate 10 and to separate them, for example, in a sawing process, in a final process step after manufacture of the respective mold packages.

Figure 5A:
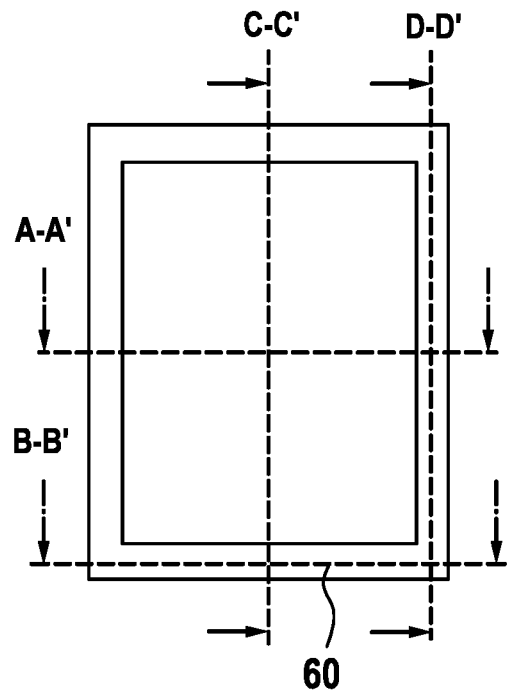
FIGS. 5a) through 5e) schematically show representations for explaining an ASIC chip of the micromechanical sensor device according to the first specific embodiment of the present invention.

FIGS. 5a) through 5e) schematically show representations for explaining an ASIC chip of the micromechanical sensor device according to the first specific embodiment of the present invention.

Figure 5B:
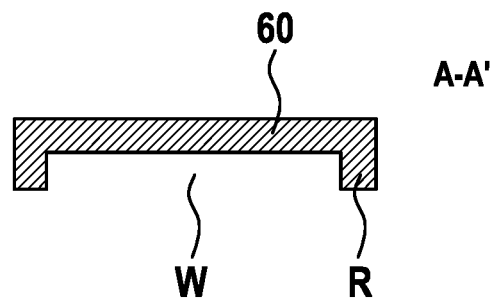
Figure 5C:
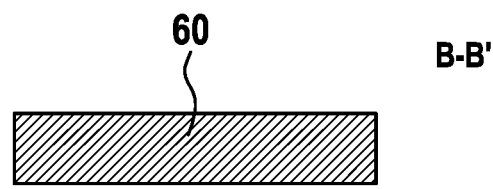
Figure 5D:
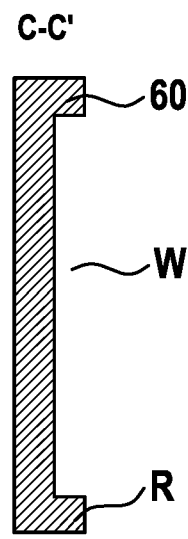
Figure 5E:
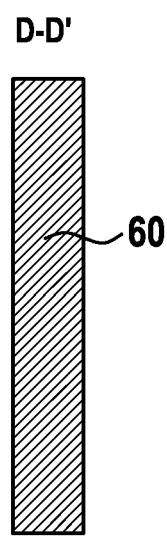

FIG. 5a) is a schematic top view, FIG. 5b) is a schematic cross sectional view along line A-A' in FIG. 5a), FIG. 5c) is a schematic cross sectional view along line B-B' in FIG. 5a), FIG. 5d) is a schematic cross sectional view along line C-C' in FIG. 5a) and FIG. 5e) is a schematic cross sectional view along line D-D' in FIG. 5a).

FIGS. 5a) through 5c) show in detail the structure of ASIC chip 60 including the trough-like recess W, which includes circumferential ring-shaped edge area R. This trough-like recess W may be manufactured in a process step (not shown) using conventional etching methods such as, for example, DRIE etching or also KOH etching, the edge area R being masked accordingly.

Figure 6A:
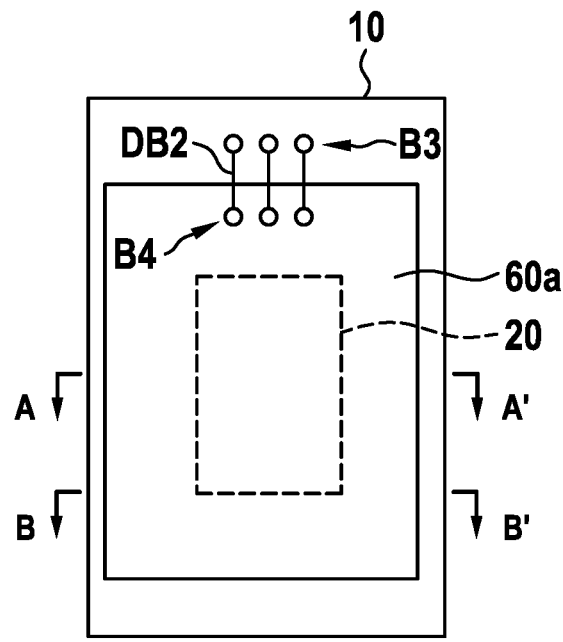
FIGS. 6a) through 6c) schematically show representations for explaining a micromechanical sensor device and a corresponding manufacturing method according to a second specific embodiment of the present invention.

FIGS. 6a) through 6c) schematically show representations for explaining a micromechanical sensor device and a corresponding manufacturing method according to a second specific embodiment of the present invention.

Figure 6B:
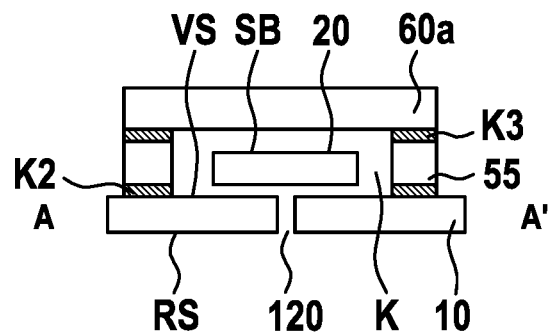
Figure 6C:
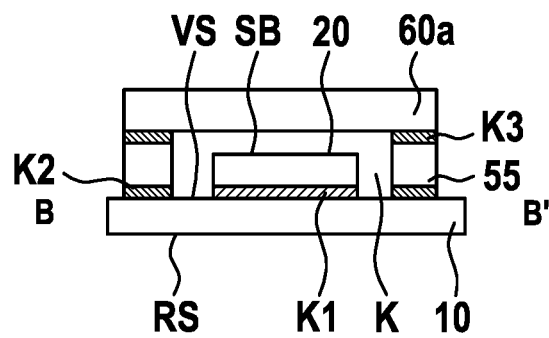

FIG. 6a) is a schematic top view, FIG. 6b) is a schematic cross sectional view along line A-A' in FIG. 6a) and FIG. 6c) is a schematic cross sectional view along line B-B' in FIG. 6a).

According to FIGS. 6a) through 6c), ASIC chip 60a has a planar design and is attached via a ring-shaped spacer unit 55 to front side VS of substrate 10 via second adhesive layer K2 and a third adhesive layer K3 between spacer unit 55 and ASIC chip 60a.

The second specific embodiment otherwise corresponds to the first specific embodiment described above.

Figure 7A:
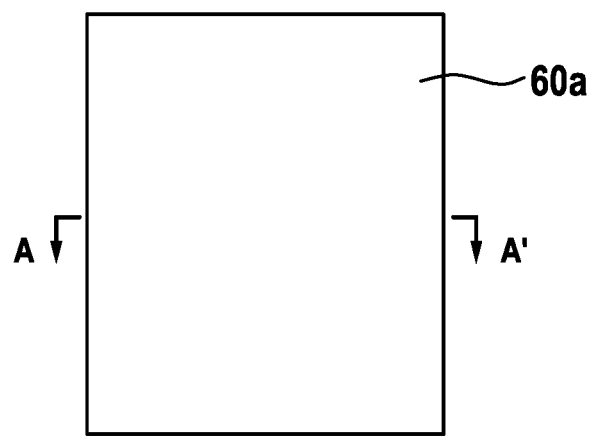
FIGS. 7a) and 7b) schematically show representations for explaining an ASIC chip of the micromechanical sensor device according to the second specific embodiment of the present invention.

FIGS. 7a) and 7b) schematically show representations for explaining an ASIC chip of the micromechanical sensor device according to the second specific embodiment of the present invention.

Figure 7B:
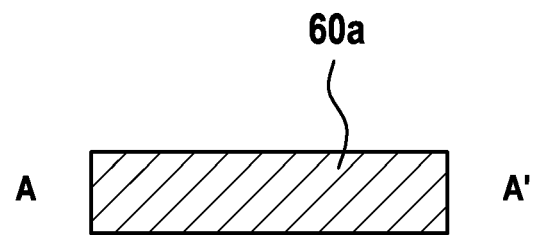

FIG. 7a) is a schematic top view and FIG. 7b) is a schematic cross-sectional view along line A-A' in FIG. 7a).

As shown in FIGS. 7a) and 7b), no modifications of standard ASIC chips 60a are needed in the second specific embodiment.

Figure 8A:
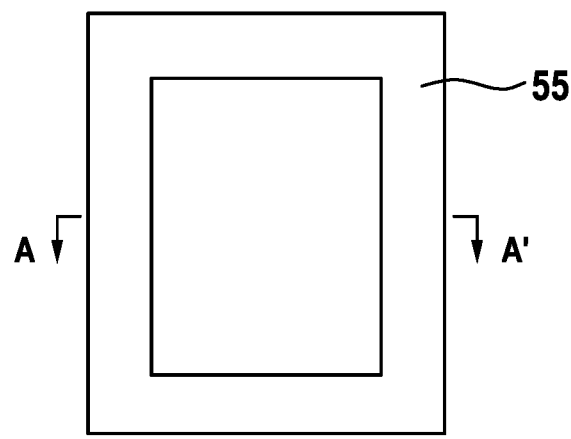
FIGS. 8a) and 8b) schematically show representations for explaining a spacer of the micromechanical sensor device according to the second specific embodiment of the present invention.

FIGS. 8a) and 8b) schematically show representations for explaining a spacer of the micromechanical sensor device according to the second specific embodiment of the present invention.

Figure 8B:
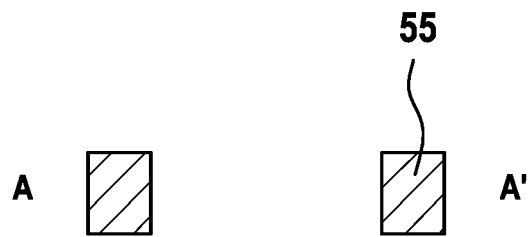

FIG. 8a) is a schematic top view and FIG. 8b) is a schematic cross sectional view along line A-A' in FIG. 8a).

As indicated in FIGS. 8a) and 8b), spacer unit 55 has essentially the same lateral dimensions as ASIC chip 60a, thus optimizing the adhesive bonding area of third adhesive layer K3.

Such spacer units 55 may be produced from silicon, ceramics, glass or from plastics in a wafer composite and, for example, may be connected to the ASIC wafer via wafer joining, if a plurality of micromechanical sensor devices are manufactured in parallel and subsequently separated. Alternatively, they may also be manufactured, prepared and mounted as individual elements on respective substrate 10.

Figure 9A:
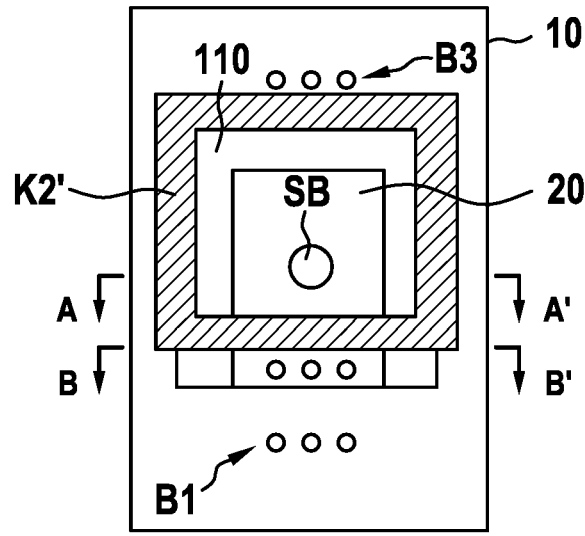
FIGS. 9a) through 9c) and 10a) through 10c) schematically show representations for explaining a micromechanical sensor device and a corresponding manufacturing method according to a third specific embodiment of the present invention.

FIGS. 9a) through 9c) and 10a) through 10c) schematically show representations for explaining a micromechanical sensor device and a corresponding manufacturing method according to a third specific embodiment of the present invention.

Figure 9B:
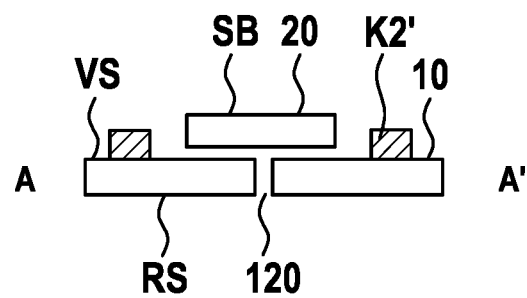
Figure 9C:
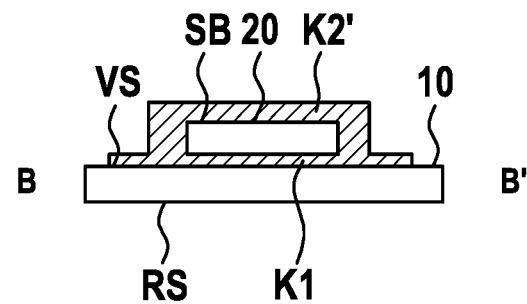
Figure 10A:
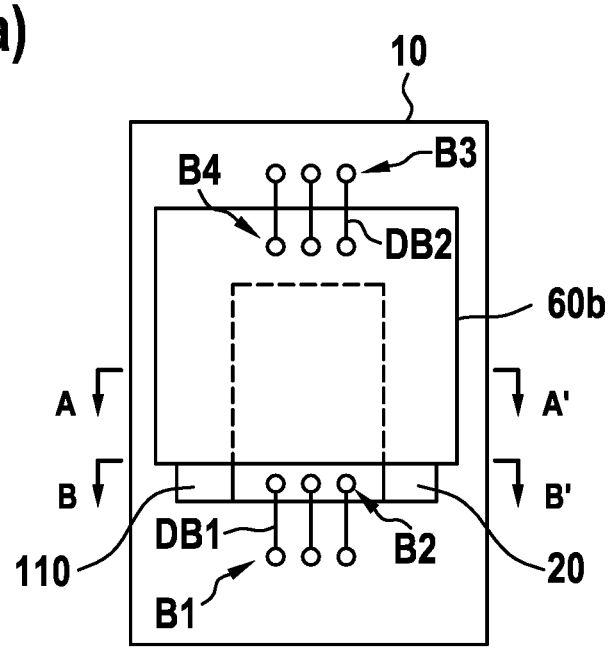
Figure 10B:
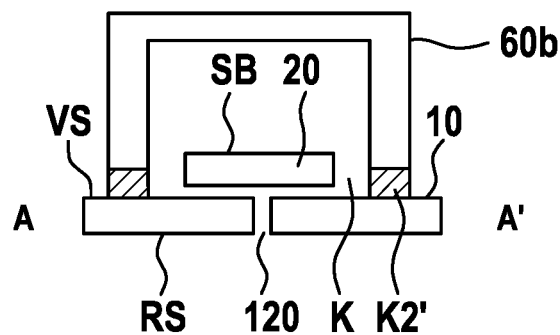
Figure 10C:
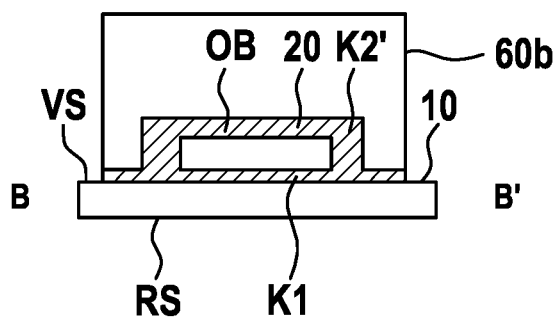

FIGS. 9a) and 10a) are schematic top views, FIGS. 9b) and 10b) are schematic cross sectional views along line A-A' in FIGS. 9a) and 10a), and FIGS. 9c) and 10c) are schematic cross sectional views along line B-B' in FIGS. 9a) and 10a).

According to FIGS. 9a) through 9c) and 10a) through 10c), ASIC chip 60b only partially covers micromechanical sensor chip 20, it being ensured that cavity K is formed above sensor area SB.

For this purpose, a recess W' of ASIC chip 60b must be designed in such a way that ASIC chip 60b is surrounded on only three sides by a u-shaped edge area R'. Second adhesive layer K2' in this specific embodiment is applied in such a way that the open portion of u-shaped edge area R' is attached directly to micromechanical sensor chip 20. In other words, second adhesive layer K2' is guided in steps over micromechanical sensor chip 20 (sword bonding). The other sides of second adhesive layer K2' are, as in the case of the above-described specific embodiment, applied to substrate 10 spaced apart from micromechanical sensor chip 20 in such a way that, as in the above specific embodiments, a ring-shaped adhesive area is formed.

Sensor area SB is thus sealed off toward front side VS of substrate 10 on all sides, which prevents a penetration of molding compound during the formation of mold package 80. The wire bonding of micromechanical sensor chip 20 may take place in this specific embodiment also after the application of ASIC chip 60b with the aid of first wire bonding unit DB1, i.e., together with the formation of second wire bonding arrangement DB2 of ASIC chip 60b, which further simplifies the process.

In order to achieve a minimal overall height, first and second wire bonding unit DB1, DB2 may be designed in this and in the other specific embodiments in the form of "low-loop wire bonds."

Figure 11A:
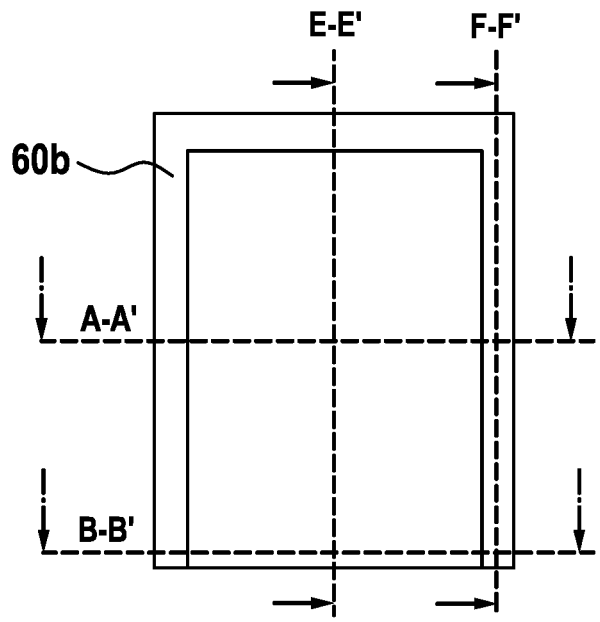
FIGS. 11a) through 11e) schematically show representations for explaining an ASIC chip of the micromechanical sensor device according to the third specific embodiment of the present invention.

FIGS. 11a) and 11b) schematically show representations for explaining an ASIC chip of the micromechanical sensor device according to the third specific embodiment of the present invention.

Figure 11B:
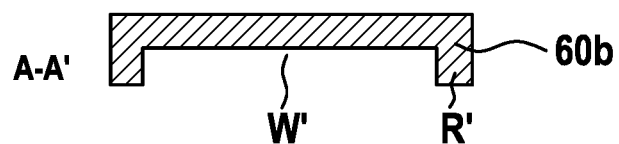
Figure 11C:
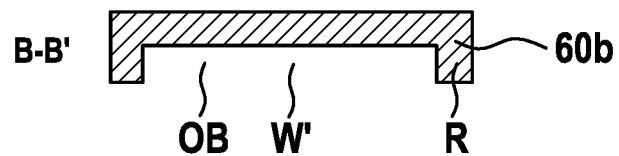
Figure 11D:
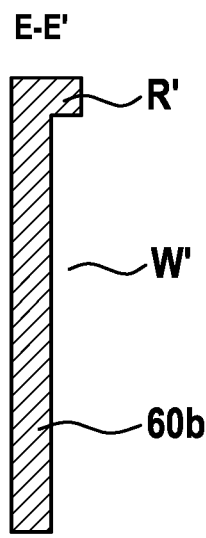
Figure 11E:
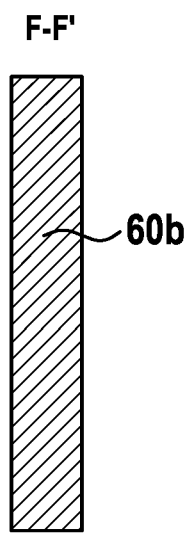

FIG. 11a) is a schematic top view, FIG. 11b) is a schematic cross sectional view along line A-A' in FIG. 11a), FIG. 11c) is a schematic cross sectional view along line B-B' in FIG. 11a), FIG. 11d) is a schematic cross sectional view along line E-E' in FIG. 11a), and FIG. 11e) is a schematic cross sectional view along line F-F' in FIG. 11a).

According to FIGS. 11a) through 11c), ASIC chip 60b is illustrated in detail. U-shaped edge area R' and the open portion of u-shaped edge area R' are apparent, so that a trough-shaped recess W' is formed open on one side.

Figure 12A:
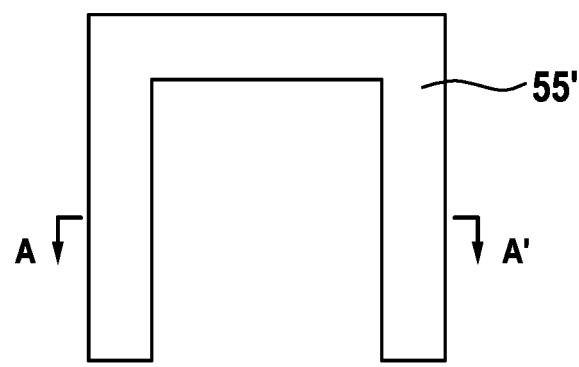
FIGS. 12a) and 12b) schematically show representations for explaining a spacer of the micromechanical sensor device according to a fourth specific embodiment of the present invention.

FIGS. 12a) and 12b) schematically show representations for explaining a spacer of the micromechanical sensor device according to a fourth specific embodiment of the present invention.

Figure 12B:

FIG. 12a) is a schematic representation and FIG. 12b) is a schematic cross sectional view along line A-A' in FIG. 12a).

According to FIGS. 12a) and 12b), it is also possible to modify the above-described specific embodiments according to FIGS. 9a) through c) and 10a) through c) in such a way that a planar sensor chip 60a according to FIGS. 7a), b) is used, by analogy with the specific embodiment according to FIGS. 6a) through c), a u-shaped spacer unit 55' being attached to front side VS of the substrate, and ASIC chip 60a being attached in the open portion of u-shaped spacer unit 55' on micromechanical sensor chip 20.

Figure 13:
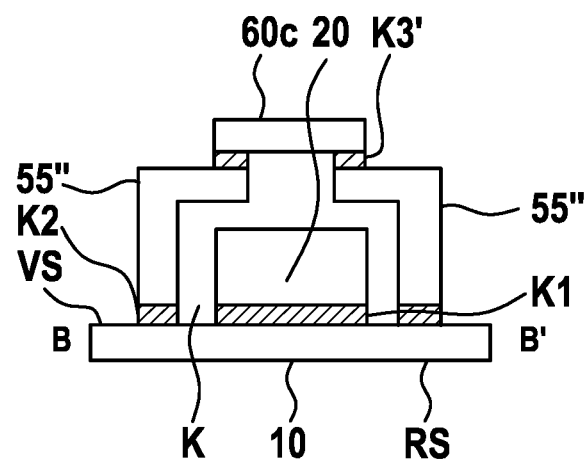
FIG. 13 schematically shows a representation for explaining a micromechanical sensor device and a corresponding manufacturing method according to a fifth specific embodiment of the present invention.

FIG. 13 schematically shows a representation for explaining a micromechanical sensor device and a corresponding manufacturing method according to a fifth specific embodiment of the present invention.

The representation according to FIG. 13 is analogous to FIG. 6c). According to FIG. 13, ASIC chip 60c is smaller than ASIC chip 60a in FIG. 6c). Accordingly, spacer unit 55" is angled in order to compensate for the surface difference between ASIC chip 60c and micromechanical sensor chip 20. The connection between spacer unit 55" and ASIC chip 60c takes place via adhesive layer K3'.

The present invention, although it has been described based on preferred exemplary embodiments, is not limited thereto. The materials and topologies cited are only exemplary and not limited to the explained examples.

The above exemplary embodiments have been explained with reference to micromechanical pressure sensors, but are, in principle, applicable for arbitrary MEMS sensors, for example, gas sensors, acceleration sensors, etc.

Although a wire bonding of the micromechanical sensor chip and of the ASIC chip to the substrate takes place in each of the above specific embodiments, the electrical connection between micromechanical sensor chip and ASIC chip may take place directly or also via the metallic structures of the substrate.

Thus, the present invention may be used in all MEMS sensor devices in which MEMS sensor and evaluation electronics (ASIC chip) are present on two discrete chips, and in which the ASIC chip has approximately the same surface dimensions as or larger surface dimensions than the MEMS chip.

What is claimed is:

1. A micromechanical sensor device, comprising:
   a substrate including a front side and a rear side;
   a micromechanical sensor chip including a sensor area attached to the front side of the substrate;
   a capping unit attached to the front side of the substrate, which is formed at least partially by an ASIC chip, the capping unit surrounding the micromechanical sensor chip in such a way that a cavity closed toward the front side of the substrate is formed between the sensor area of the micromechanical sensor chip and the ASIC chip; and
   a mold package formed above the capping unit,
   wherein the ASIC chip partially covers the micromechanical sensor chip and includes a recess, which has a u-shaped edge area, which is directly attached to the front side of the substrate, and an open portion of the u-shaped edge area is attached directly to the micromechanical sensor chip.

2. The micromechanical sensor device as recited in claim 1, wherein the ASIC chip has a trough-like recess, which includes a circumferential ring-shaped edge area, which is attached indirectly or directly to the front side of the substrate.

3. The micromechanical sensor device as recited in claim 1, wherein the ASIC chip has a planar design and is attached to the front side of the substrate via a ring-shaped spacer unit.

4. The micromechanical sensor device as recited in claim 1, wherein the ASIC chip partially covers the micromechanical sensor chip and has a planar design and is attached via a u-shaped spacer unit directly to the front side of the substrate, and the ASIC chip is directly attached to the micromechanical sensor chip in an open portion of the u-shaped spacer unit.

5. The micromechanical sensor device as recited in claim 1, wherein the micromechanical sensor chip is bonded onto the front side of the substrate in a linear and/or punctiform manner.

6. The micromechanical sensor device as recited in claim 1, wherein the micromechanical sensor chip is a pressure sensor chip.

7. The micromechanical sensor device as recited in claim 1, wherein the substrate is an line grid array (LGA) substrate.

8. A micromechanical, comprising:
   a substrate including a front side and a rear side;
   a micromechanical sensor chip including a sensor area attached to the front side of the substrate;
   a capping unit attached to the front side of the substrate, which is formed at least partially by an ASIC chip, the capping unit surrounding the micromechanical sensor chip in such a way that a cavity closed toward the front side of the substrate is formed between the sensor area of the micromechanical sensor chip and the ASIC chip; and
   a mold package formed above the capping unit,
   wherein a through-opening in the substrate forms a media access opening to the cavity toward the rear side of the substrate.

9. The micromechanical sensor device as recited in claim 8, wherein a microporous diaphragm is attached above the through-opening on the rear side of the substrate.

10. A method for manufacturing a micromechanical sensor device, comprising the following steps:
    providing a substrate including a front side and a rear side;
    attaching a micromechanical sensor chip including a sensor area to the front side of the substrate;
    forming a capping unit attached to the front side of the substrate, which is formed at least partially by an ASIC chip, the capping unit surrounding the micromechanical sensor chip in such a way that a cavity closed toward the front side of the substrate is formed between the sensor area of the micromechanical sensor chip and the ASIC chip; and
    forming a mold package above the capping unit,
    wherein the ASIC chip partially covers the micromechanical sensor chip and includes a recess, which has a u-shaped edge area, which is directly attached to the front side of the substrate, and an open portion of the u-shaped edge area is attached directly to the micromechanical sensor chip.

11. The method as recited in claim 10, wherein the ASIC chip includes a trough-like recess, which includes a circumferential ring-shaped edge area, which is attached indirectly or directly to the front side of the substrate.

12. The method as recited in claim 10, wherein the ASIC chip has a planar design and is attached to the front side of the substrate via a ring-shaped spacer unit.

13. The method as recited in claim 10, wherein the ASIC chip partially covers the micromechanical sensor chip and has a planar design, and is attached directly to the front side of the substrate via a u-shaped spacer unit, and the ASIC chip is attached directly to the micromechanical sensor chip in an open portion of the u-shaped spacer unit.

* * * * *